(12) United States Patent
Lee (10) Patent No.: US 8,605,798 B2
(45) Date of Patent: Dec. 10, 2013

(54) POWER AND BIDIRECTIONAL DATA TRANSMISSION

(75) Inventor: Edward K. F. Lee, Fullerton, CA (US)

(73) Assignee: Alfred E. Mann Foundation for Scientific Research, Santa Clarita, CA (US)

( * ) Notice: Subject to any disclaimer, the term of this patent is extended or adjusted under 35 U.S.C. 154(b) by 0 days.

(21) Appl. No.: 13/235,242

(22) Filed: Sep. 16, 2011

(65) Prior Publication Data

US 2012/0287984 A1 Nov. 15, 2012

Related U.S. Application Data

(63) Continuation-in-part of application No. 12/464,831, filed on May 12, 2009, which is a continuation-in-part of application No. 12/464,843, filed on May 12, 2009, now Pat. No. 8,284,830.

(60) Provisional application No. 61/383,690, filed on Sep. 16, 2010.

(51) Int. Cl.
*H04B 3/00* (2006.01)

(52) U.S. Cl.
USPC ............. 375/257; 340/12.32; 340/12.37; 340/13.23; 340/538.15; 326/30

(58) Field of Classification Search
None
See application file for complete search history.

(56) References Cited

U.S. PATENT DOCUMENTS

| | | | |
|---|---|---|---|
| 4,279,033 A | 7/1981 | Brunelli | |
| 4,363,121 A | 12/1982 | Schlyter | |
| 4,477,896 A | 10/1984 | Aker | |
| 4,941,201 A * | 7/1990 | Davis | 455/41.2 |
| 5,424,860 A | 6/1995 | Mihara | |
| 5,578,939 A | 11/1996 | Beers | |
| 5,666,302 A | 9/1997 | Tanaka | |
| 5,872,471 A | 2/1999 | Ishibushi | |
| 5,898,666 A | 4/1999 | Fukuda | |
| 6,906,618 B2 | 6/2005 | Hair | |
| 6,972,597 B2 | 12/2005 | Kim | |

(Continued)

FOREIGN PATENT DOCUMENTS

| EP | 1703627 A2 | 9/2006 |
|---|---|---|
| EP | 2257009 A2 | 12/2010 |

OTHER PUBLICATIONS

Search Report and Written Opinion, European Patent Application EP 11181567.6, Jan. 31, 2012.

(Continued)

*Primary Examiner* — Adolf Dsouza
(74) *Attorney, Agent, or Firm* — Oleh J. Zajac (57) ABSTRACT

Systems and methods for power and bidirectional data transmission using a plurality of wires. A multiphase digital signal is downlinked from a main unit to a remote unit over the plurality of wires and is converted to a DC power signal used to power the remote unit. Uplink data is sent from the remote to the main over one selected wire during a predetermined time period for an uplink transmission by amplitude modulating the received digital signal at the remote. During an uplink, the output impedance of the line driver in the main unit connected to the wire selected for the uplink is increased to allow for the uplink amplitude modulation. The modulated signal is maintained within the noise margins of the digital circuits in the main and remote units.

20 Claims, 10 Drawing Sheets

(56) References Cited

U.S. PATENT DOCUMENTS

| | | |
|---|---|---|
| 7,015,798 B2 | 3/2006 | Hair |
| 7,158,573 B2 | 1/2007 | Hershbarger |
| 7,439,821 B2 | 10/2008 | Schulman |
| 2003/0197528 A1 | 10/2003 | Shibata |
| 2006/0117089 A1* | 6/2006 | Karam ............................ 709/208 |
| 2007/0140473 A1 | 6/2007 | Ishibe |
| 2008/0031166 A1 | 2/2008 | Fukuda |
| 2010/0027710 A1 | 2/2010 | Fukuda |
| 2010/0290516 A1 | 11/2010 | Lee |
| 2010/0290517 A1 | 11/2010 | Lee |

OTHER PUBLICATIONS

Mandal, et al., Power Efficient Impedance Modulation Wireless Data Links in Biomedical Implants, IEEE Transactions on Biomedical Circuits and Systems, vol. 2, No. 4, Dec. 2008, pp. 301-315.

* cited by examiner

POWER AND BIDIRECTIONAL DATA TRANSMISSION

CROSS REFERENCE TO RELATED APPLICATIONS

The present application claims the benefit from U.S. provisional application Ser. No. 61/383,690 filed on Sep. 16, 2010, which is incorporated herein by reference. The present application is a continuation in part of U.S. patent application Ser. No. 12/464,831 entitled Pulse Edge Modulation, filed on May 12, 2009, which is incorporated herein by reference. The present application is also a continuation in part of U.S. patent application Ser. No. 12/464,843 entitled Pulse Edge Demodulation, filed on May 12, 2009, which is incorporated herein by reference.

FIELD OF THE INVENTION

The present invention generally relates to systems and methods for power and bidirectional data transmission on a plurality of wires.

BACKGROUND

In an implantable battery powered biomedical device, the size and mass of the battery and the associated integrated circuits, as well as other passive components may not allow such a system to be directly attached to body parts, such as nerve bundles and cortices, directly. As a result, the implantable device may be separated into two units: a remote unit and a main unit. The remote unit may include microelectrode arrays with lighter mass and smaller size and may attach to the body parts where sensing of biosignals or stimulation of the nerves are actually applied. The main unit may have a greater mass and larger size and may be placed at a location inside the body suitable for mounting the larger unit. When an implantable device is separated into a remote and main unit, problems can arise in transmitting power and data between the remote unit and the main unit.

An implanted system sending power between two or more devices implanted in body tissue cannot use DC to send power over wires from one device to another, because if there were a break in the insulation of one of the wires, then harmful leakage of electrical current into the body tissue could occur. Commonly assigned U.S. Pat. No. 7,439,821 entitled "DC to DC Transmission System", incorporated herein by reference, describes a system using a three phase digital signal to transmit power over three wires instead of a DC signal. Commonly assigned U.S. patent application Ser. No. 12/464,831 entitled "Pulse Edge Modulation", published as US2010/0290516A1, and U.S. patent application Ser. No. 12/464,843 entitled "Pulse Edge Demodulation", published as US2010/0290517A, were both filed on May 12, 2009. These applications describe a system for sending digital data between main and remote units by modulating the edges of a multiphase digital signal. In these applications, five wires are used to connect main and remote units, with three wires used for the downlinked modulated multiphase signal and two separate wires are used for the uplink transmission. It is desirable to minimize the number of wires in the wire bundle connecting the main and remote implanted units, thus reducing the size and weight of the wire bundle.

SUMMARY OF THE INVENTION

Systems and methods for power and bidirectional data transmission using a plurality of wires are described which are useful in body implanted electronics. A multiphase digital signal is sent from a main unit to a remote unit over the plurality of wires and is converted to a DC power signal used to power the remote unit. Uplink data is sent from the remote to the main over one selected wire during a predetermined time period for an uplink transmission by amplitude modulating the received digital signal at the remote. During an uplink, the output impedance of the line driver connected to the wire selected for the uplink in the main unit is increased to allow for the uplink amplitude modulation. Nevertheless, the modulated signal is maintained within the noise margins of the digital circuits in the main and remote units to allow the signal on the selected wire to be recognized as valid digital levels by the digital circuits for proper processing. Digital data can be downlinked from the main to the remote by pulse edge modulation of the multiphase signal at the main unit.

DETAILED DESCRIPTION

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" can include reference to both the singular and the plural. The meaning of "in" can include "in" and "on." The term "connected" means a direct electrical, electro-magnetic, mechanical, logical, or other connection between the items connected, without any electrical, mechanical, logical or other intermediary there between. The term "coupled" means a direct connection between items, an indirect connection through one or more intermediaries, or communication between items in a manner that may not constitute a physical connection. The term "circuit" can mean a single component or a plurality of components, active and/or passive, discrete or integrated, that are coupled together to provide a desired function. The term "signal" means at least one current, voltage, charge, data, or other such identifiable quantity.

A multiphase signal is defined as a set of digital signals with the individual signal components having spaced phase differences and a monotonic increase of phase when going from one signal to the next one.

Figure 1:
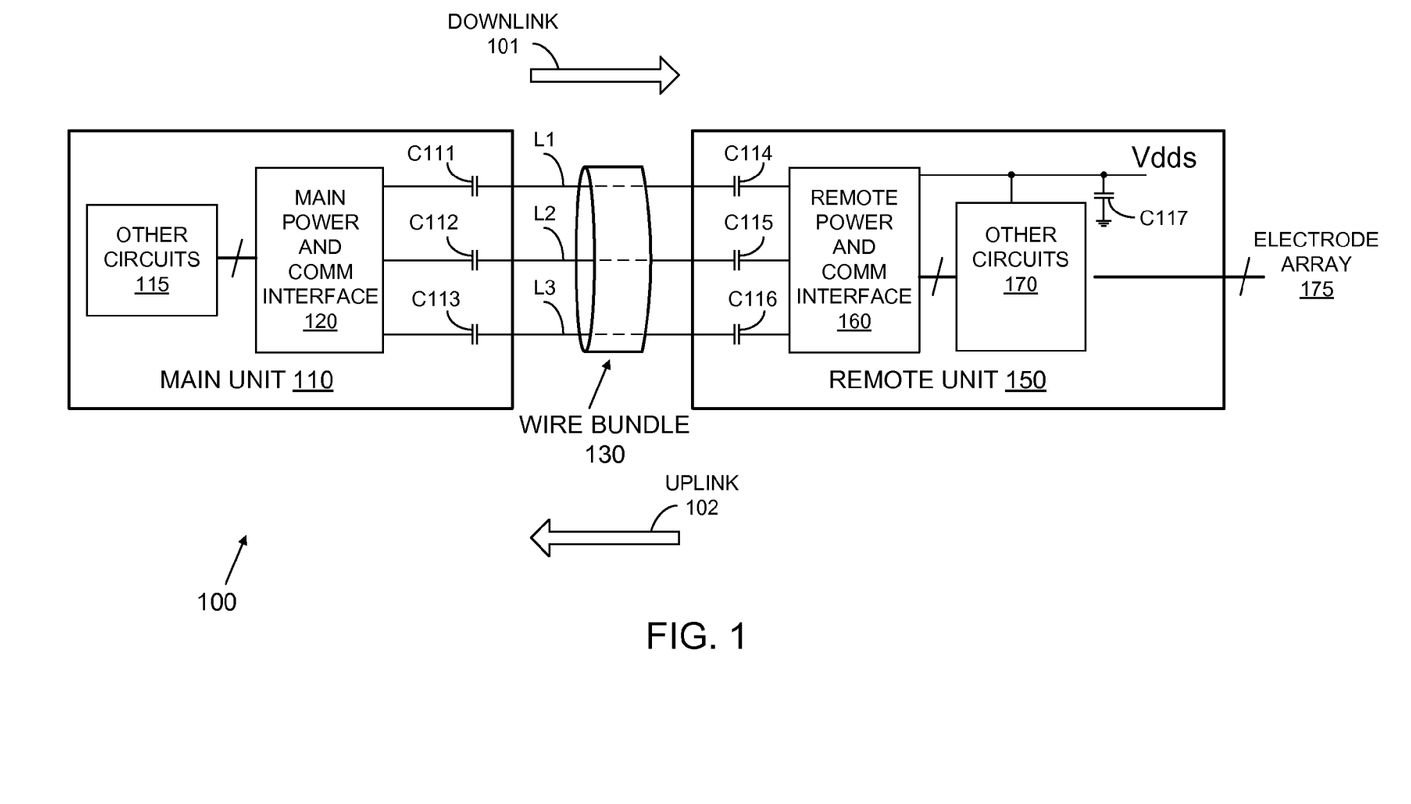
FIG. 1 is a block diagram illustrating an exemplary system for power and bidirectional data transmission between a main unit and a remote unit over a wire bundle, according to one embodiment of the present invention.

FIG. 1 is a block diagram illustrating an exemplary system 100 for power and bidirectional data transmission between a main unit 110 and a remote unit 150 using a plurality of wires in the form of a wire bundle 130 with three wires L1-L3, according to one embodiment of the present invention. The signals between the main 110 and remote 150 are AC coupled through DC blocking capacitors C111-C116. In alternate embodiments of the invention, more than one remote unit can be connected to a main unit.

Figure 2:
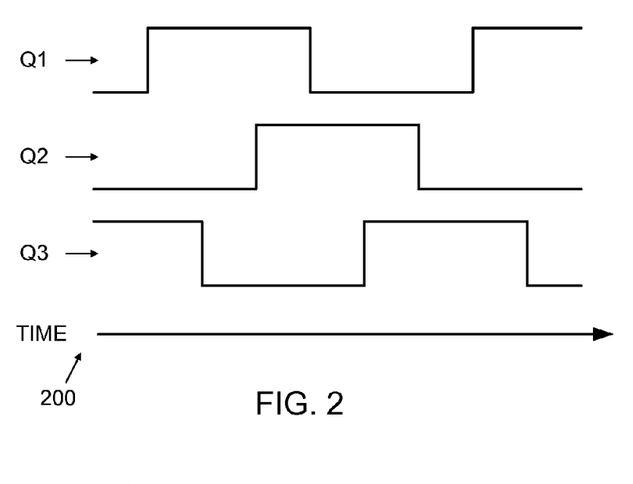
FIG. 2 is a timing diagram illustrating a multiphase digital signal having three phases, which can be used to send power from the main unit to the remote unit.

A three phase digital signal Q1-Q3, as shown in FIG. 2 is generated by power and communications Interface 120 in the main unit 110. The three phase signal is downlinked (101) and processed by power and comm. interface 160 to generate a DC signal and is used to power remote 150. In the example of FIG. 1, the remote 150 receives electrical signals from an electrode array 175, which are processed and uplinked (102) to the main unit 110. The remote 150 can also receive downlinked data signals from the main unit 110.

Figure 3:
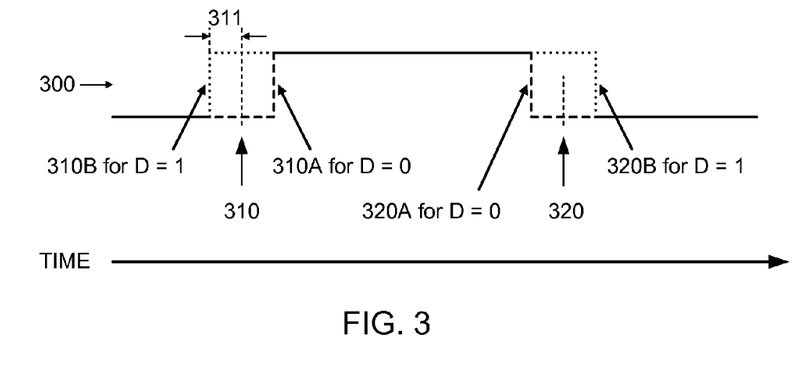
FIG. 3 is a timing diagram of one digital signal and the possible positions of the edges of such a signal, when modulated by a pulse edge modulated (PEM) system.

FIG. 3 is a timing diagram of one digital signal 300 of a multiphase signal, such as Q1-Q3 shown in FIG. 2 and the possible positions of the edges of such a signal, when modulated by a pulse edge modulated (PEM) system. The positions of the rising and falling edges of the three phase signal are modulated as illustrated in FIG. 3. To downlink a bit D with a logic value of 1 (or 0), the rising edge 310 of the digital signal 300 can be modulated slightly to the left 310A (or to the right to 310B) by a duration of 311 relative to the reference time 310 such that when modulated signal 300 is sampled by remote 150, the demodulator in 150 can demodulate edge 310A (or edge 310B) and output a downlinked bit D of logic value equal to 1 (or 0).

Similarly, the falling edge 320 of signal 300 can be modulated to the right 320B (or to the left to 320A) relative to edge 320 for D=1 (or D=0). Using this scheme, the basic shape of the three phase signal does not change significantly and the dynamic power dissipation due to parasitic capacitances between the wires L1-L3 in bundle 130 remains unchanged whether downlink modulation is activated or not.

Figure 4:
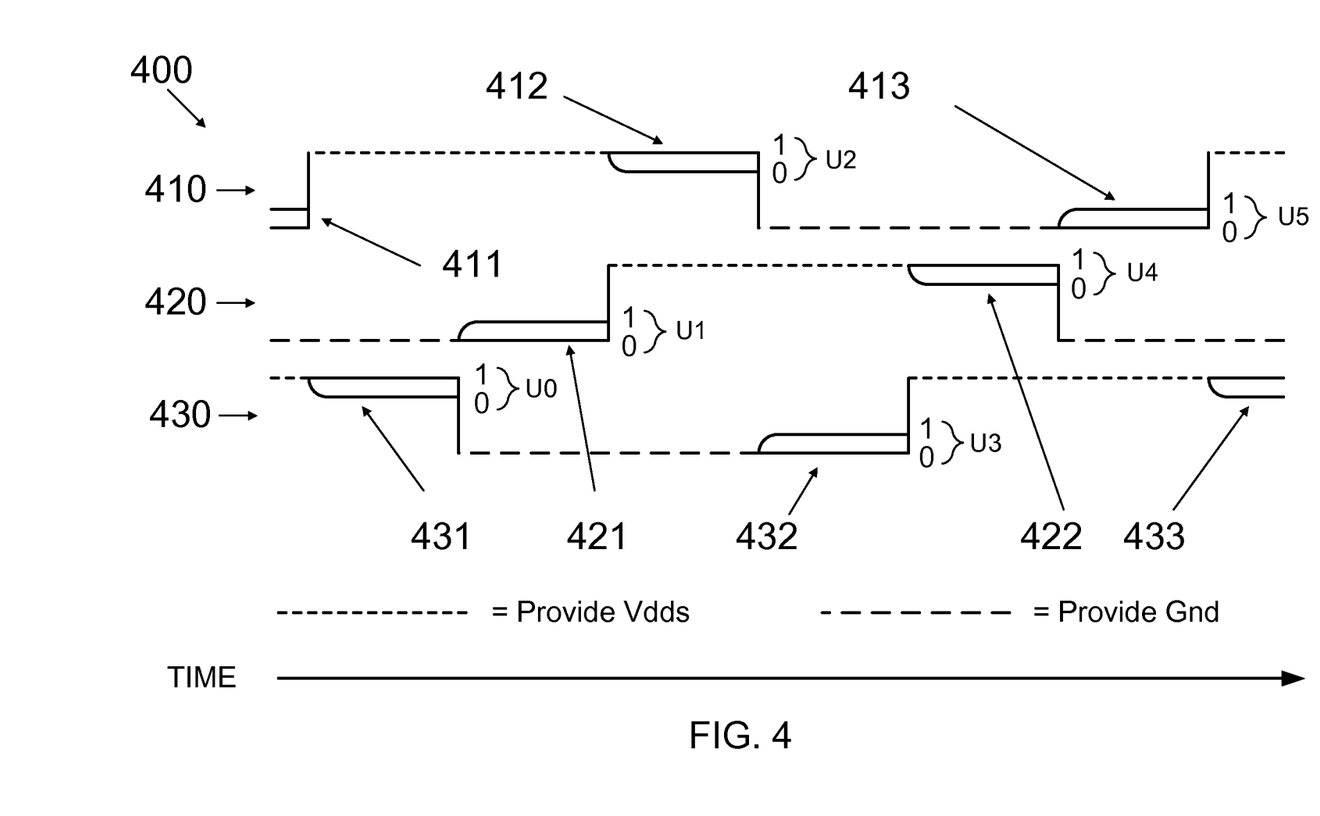
FIG. 4 is a timing diagram of bidirectional data transmission showing some possible uplink transmission time periods, according to one embodiment of the present invention.
Figure 5:
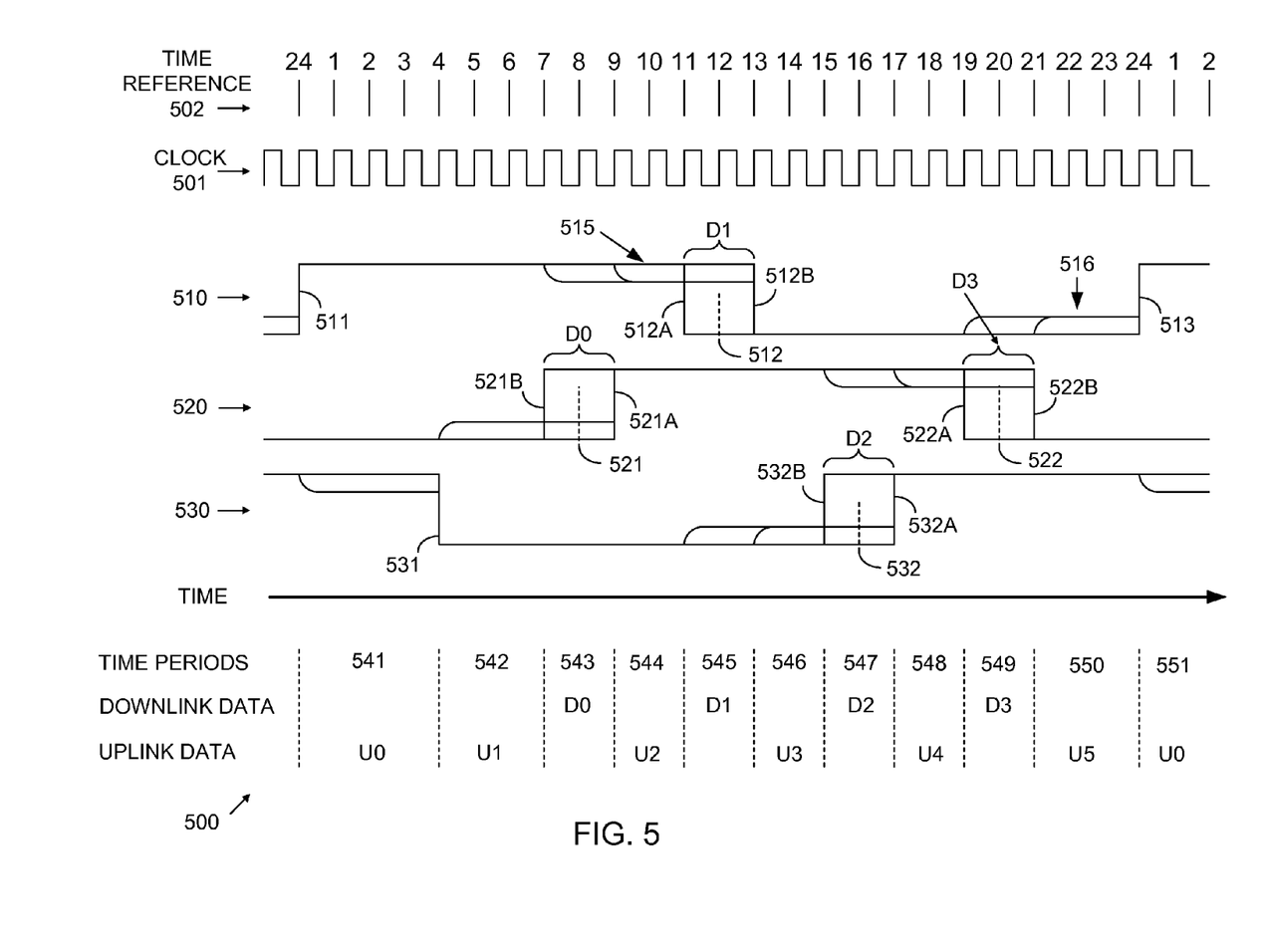
FIG. 5 is a timing diagram of bidirectional data transmission showing a multiphase digital signal with downlinked pulse edge modulated data and uplinked amplitude modulated data, according to an embodiment of the present invention.

FIG. 4 is a timing diagram of data transmission showing some possible uplink transmission time periods for a modulated three phase digital signal 400, according to one embodiment of the present invention. At any instant (other than the transition edges), only two out of the three wires are required to provide power from the main 110 to the remote 150, leaving one wire available for uplink amplitude modulation. Amplitude modulation (AM) is utilized in this present invention. FIG. 4 shows the timing for power delivery as well as uplink data modulation on each digital signal of the three phase signal on bundle 130. Digital signal 410 includes amplitude modulated sections 411, 412 and 413. Digital signal 420 includes amplitude modulated sections 421 and 422. Digital signal 430 includes amplitude modulated sections 431, 432 and 433. AM modulation, as shown in FIG. 4 occurs before the digital signal changes from one logic value to another logic value (i.e., before the transition edges). For example, uplink data modulation occurs before the falling edge 412 and rising edges 411 and 413 of 410. In other embodiments of the invention, uplink amplitude modulation can occur after the edges or before and after the edges. To simplify the presentation of the present invention, the embodiments presented herein as seen in FIGS. 4 and 5 show the amplitude modulation before the edges. If the AM modulation of a digital signal, such as 410 occurs right after the transition edges instead of before the transition edges, the line driver for that wire, such as L1, must first drive digital signal 410 from one logic state to another logic state and then go into a high output impedance mode immediately after the transitions in order to allow for uplink data modulation. In such a case, additional timing controls right after each transition edge are required for the line drivers to operate in different modes. Therefore, uplink data modulations before the transition edges are shown for the embodiments herein to eliminate these timing control requirements.

As observed from FIG. 4, AM modulation can occur during either a logic 1 or logic 0 voltage level on digital signals 410, 420 or 430. This AM modulation should not affect the basic shape of the three phase signal 400 and any downlink pulse edge modulation. Hence, a low AM modulation index is preferable.

FIG. 5 is a timing diagram of bidirectional signal transmission showing a multiphase digital signal 500 showing sections of the signals for downlinked pulse edge modulated data and uplinked amplitude modulated data, according to an embodiment of the present invention. Digital signals 510, 520 and 530 are the signals on respective wires L1-L3. Clock 501 and time reference marks 502 are shown for reference purposes, they are not sent to the remote 150 from main unit 110. Uplink data transmission from the remote 150 to the main 110 can be achieved by modulating the amplitudes of the three phase signal. As mentioned above, at any instances, only 2 out of the 3 lines L1-L3 are needed for power delivery, leaving one line available for amplitude modulation. This amplitude modulation does not affect the pulse edge modulation for downlink data transmission and hence, no additional wires are required for uplink data transfer. As illustrated in FIG. 5, during time period 541, signals 510 and 520 are used for delivering power to the remote 150, and signal 530 is available for uplink amplitude modulation according to the uplink data bit U0. Edges 511 and 531 are not being pulse edge modulated. They are used as timing reference edges for demodulating the pulse edge modulated sections received in the remote 150 from the main unit 110. In alternate embodiments of the invention, demodulating of a pulse edge modulated signal can be done without the use of any timing reference edges for demodulation. From FIG. 5, it can be observed that there are a total of four edges that can be pulse edge modulated and therefore a total of 4 bits of downlink data D0-D3 can be carried on wires L1-L3 in each three phase signal period during time periods 543, 545, 547 and 549. The number of uplink data bits U0-U5 in each three phase signal period is 6. In FIG. 5, the three phase signal has a period, for example, as defined by the time between edges 511 and 513, and this is the basis for the time reference marks 502 between the first 24 mark on the left side to the last 24 mark on the right side of FIG. 5.

The uplink time periods are "predetermined time periods for an uplink transmission", abbreviated herein as "Uplink Tx". As shown in FIG. 5, there are six possible uplink time periods 541, 542, 544, 546, 548 and 550 in each three phase period of three phase signal 500, as defined by different combinations of logic values of the three phase signal on wires L1-L3. The time periods for uplink transmissions are coincident in time with the value of each digital signal of the three phase digital signal being in a constant digital state, i.e., there are no edge transitions in the uplink time periods. The lengths of the amplitude modulated sections next to pulse edge modulated edges depend on the positions of the transition edges as determined by the downlink data. For example, if edge 512 is pulse edge modulated to position 512A, then the right edge of uplink section 515 will stop at edge 512A. If edge 512 is pulse edge modulated to position 512B, then the right edge of uplink section 515 will extend to position 512B. Similarly, the left edge of uplink section will be shorter or longer depending on the result of pulse edge modulation of edge 521 for digital signal 520.

The signal voltages on L1-L3 are used as inputs to various digital circuits inside main unit 110 and remote unit 150. As a result, the uplink AM data modulations on each wire L1-L3 must be within the noise margin of the inputs of the digital circuits so that the correct digital states can be identified in signal 500. For example, the signal modulated with uplink digital data has to be within the noise margin of the input of the demodulator in the main unit. For example, the signal modulated with downlink digital data has to be within the noise margin of the input of the demodulator in the remote unit. Noise margin for a digital circuit can be defined as the amount by which a signal exceeds a threshold for a proper "0" or "1".

Figure 6:
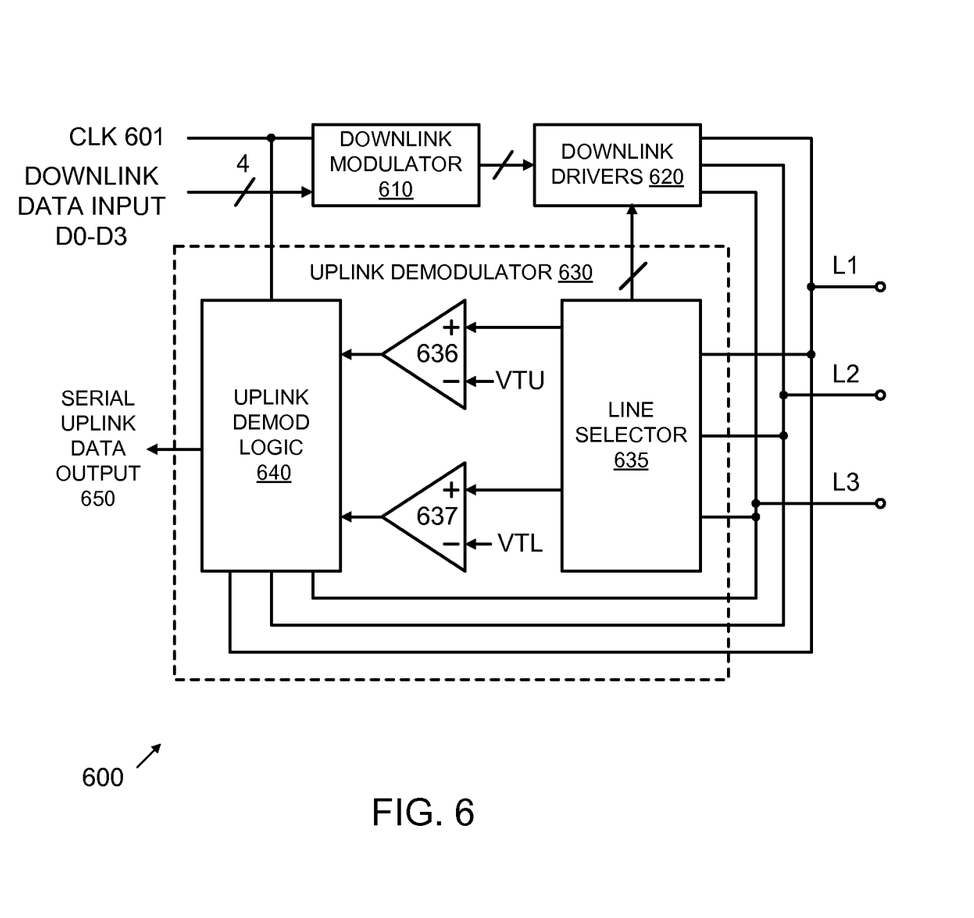
FIG. 6 is a block diagram of an exemplary power and communications interface system for a main unit, according to one embodiment of the present invention.

FIG. 6 is a block diagram of an exemplary power and communications interface system 600 for a main unit 120, according to one embodiment of the present invention. FIG. 6 includes downlink modulator 610, downlink drivers 620 and uplink demodulator 630. Downlink drivers 620 include three downlink drivers, one for each wire. Uplink demodulator 630 includes line selector 635, comparators 636 and 637 and uplink demodulator logic 640. Each downlink driver within 620 has 2 modes of operation, i.e., low and high impedance outputs, as controlled by line selector 635.

Since uplink modulation can occur on logic 0 or logic 1 as shown in FIGS. 4 and 5, two comparators: 636 and 637 are used to detect the uplink data that are either close to the positive supply rail or to the ground rail, respectively. The comparator threshold values, VTU and VTL, are set to 0.5·RM1/(RM1+RR1) from the two supply rails, where RM1 and RR1 are discussed with respect to FIG. 9. During the various time periods that an uplink transmission can occur, line selector 635 will connect the appropriate signal from wires L1-L2 to the input of 636 or 637 for uplink data demodulation. The starting point in time of an uplink data transmission depends on the digital states of the three phase signal and therefore depends on the positions of the edges modulated by downlink data D0-D3 as previously discussed with regard to FIG. 5.

Figure 7:
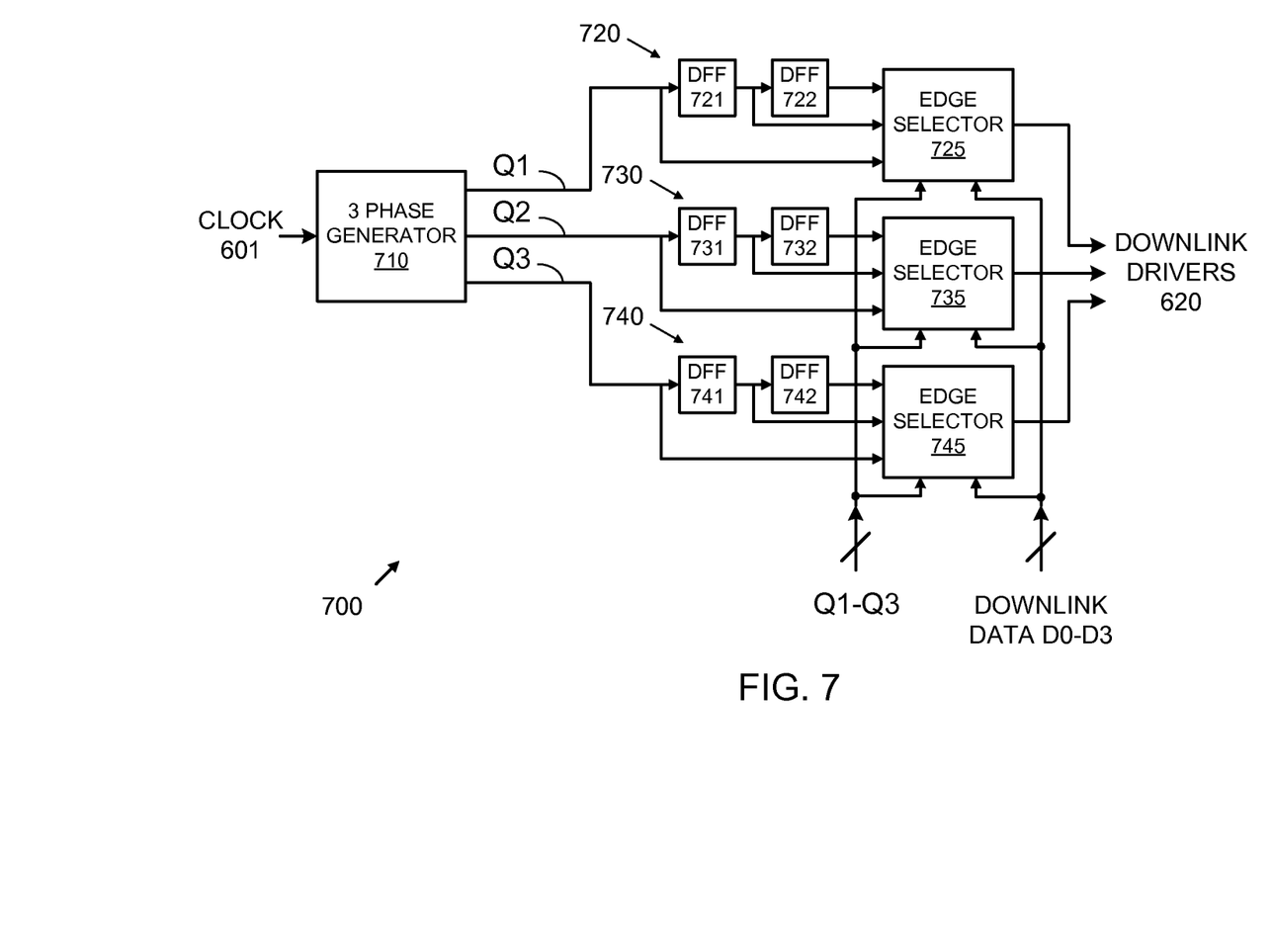
FIG. 7 is block diagram of an exemplary downlink modulator, according to an embodiment of the present invention.

FIG. 7 is a block diagram of an exemplary downlink modulator 700 and is one embodiment of the downlink modulator 610 in FIG. 6. FIG. 7 includes three phase generator 710, delay lines 720, 730 and 740 and edge selectors 725, 735 and 745. Three phase generator 710, generates three phase signal Q1-Q3 which has a frequency equal to the input clock 601 divided by 24. Three phase generator 710 can be implemented using a digital counter. Signals Q1, Q2 and Q3 are fed to 3 delay lines 720, 730 and 740, which are each realized by 3 respective sets of two D flip-flops (721-722; 731-732 and 741-742) and are driven by clock 601. The digital states of the downlink data bits D0-D3 and the digital states of Q1-Q3 determine how edge selectors 725, 735 and 745 output the corresponding flip-flop outputs to the downlink drivers 620 to achieve pulse edge modulation. The time shifts (i.e., ±311 as shown in FIG. 3) from the reference times (512, 521, 522 and 532 on the modulated edges are determined by the delays of the flip-flops in 700 and are equal to ±1 input clock period. The reference edges 511 and 531, as shown in FIG. 5, are obtained by tapping the middle outputs of the first delay line 720 and the third delay line 740 according to the values of the three phase signal Q1-Q3.

Figure 8:
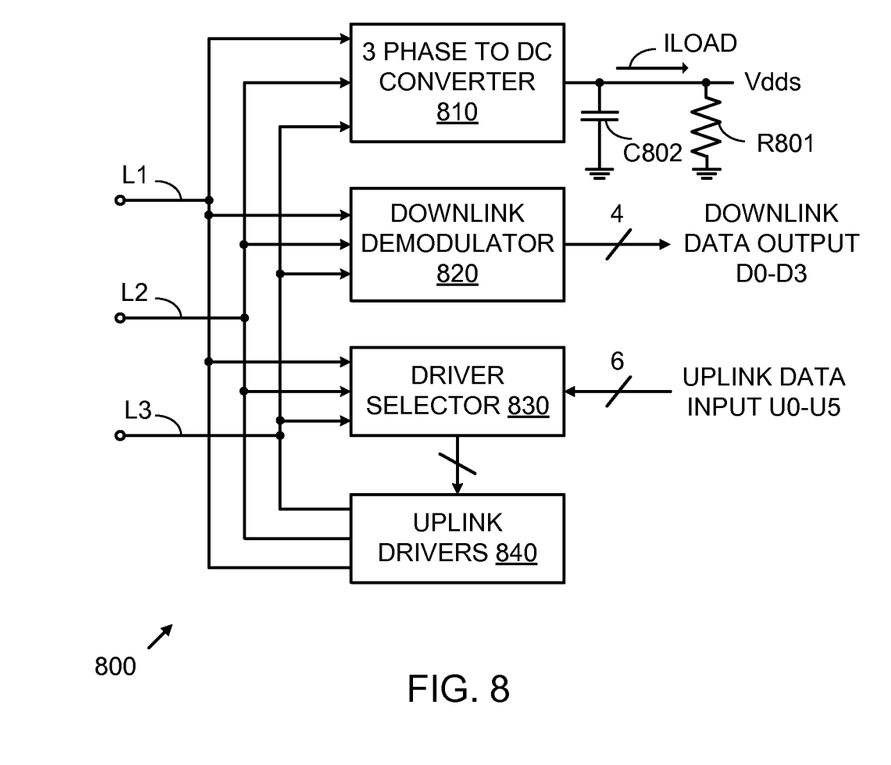
FIG. 8 is a block diagram of an exemplary power and communications interface for a remote unit, according to one embodiment of the present invention.

FIG. 8 is a block diagram of an exemplary power and communications interface 800 and is one embodiment of an interface 160 for a remote unit 150, according to one embodiment of the present invention. Interface 800 includes three phase to DC converter 810, downlink demodulator 820, driver selector 830, uplink drivers 840, shunt capacitor C802 and load R801. Converter 810 extracts DC power from the three phase signal on lines L1-L3. Driver selector 830 directs the uplink data input bits U0-U5 to the corresponding three uplink drivers within uplink drivers 840 based on the digital states of the three phase signal Q1-Q3 on respective lines L1-L3. Uplink AM data modulation is controlled by the output impedance of the downlink driver and will be discussed with respect to FIG. 9.

Figure 9:
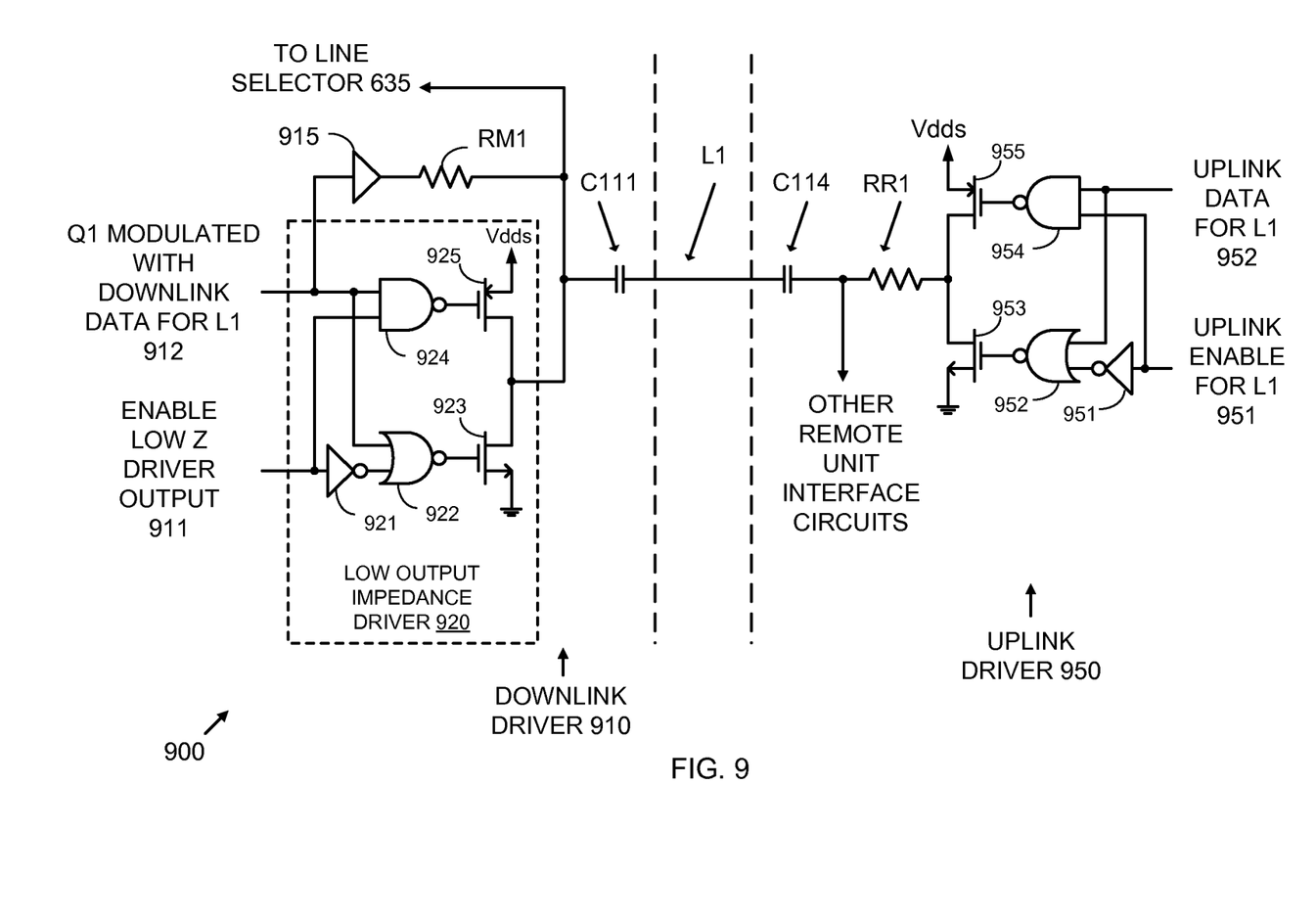
FIG. 9 is a block diagram of exemplary downlink and uplink drivers for a system according to an embodiment of the present invention.

FIG. 9 is a block diagram of exemplary downlink driver 910 and uplink driver 950 for one wire L1 of a system according to an embodiment of the present invention. Main unit 110 includes downlink driver 910 and remote unit 150 includes uplink driver 950. Downlink driver 910 includes buffer 915, resistor RM1 and low output impedance driver 920. Driver 920 includes transistors 923 and 925 driven by inverter 921 and gates 922 and 924. Input line 912 to driver 920 receives digital signal Q1 as pulse edge modulated by downlink data from the output of edge selector 725 in interface 700 shown in FIG. 7. Input line 911 to downlink driver 910 controls the output impedance of downlink driver 910. When control line 911 is high, then the low output impedance driver 920 is operating to maintain the low output impedance of downlink driver 910, when L1 is used to send power to remote 150. When control line 911 is low, then the output impedance of downlink driver 910 is set to high, when wire L1 is used for an uplink transmission. Uplink driver 950 includes resistor RR1 and transistors 953 and 955 driven by inverter 951 and gates 952 and 954. Uplink driver 950 receives uplink data for wire L1 and uplink enable control signal for L1. Uplink driver 950 amplitude modulates the digital signal received on wire L1 with uplink data and thus functions as an uplink modulator.

As discussed previously with regard to FIG. 5, the uplink time periods 541, 542, 544, 546, 548 and 550 during a period of a three phase signal 500 are "predetermined time periods for an uplink transmission"="Uplink Tx" when an uplink transmission can take place on one of the wires L1-L3. For example, if time period 544 is to be used for an uplink, then L1 and its corresponding uplink and downlink drivers are selected for the uplink and L2-L3 and their corresponding drivers will be selected for DC power transmission.

When three phase signal 500 is in one of the six time periods for an uplink, then the corresponding 2 out of 3 downlink drivers are selected and set to low output impedances with high drive capability for power delivery. The other downlink driver will be selected and set to a high output impedance mode, by disabling the high driving capability path in driver 920. With a high output impedance, the logic output level of the downlink driver 910 will be maintained at the same digital state due to buffer 915 but providing relatively high output impedance due to resistor RM1. Hence, the downlink driver 910 will allow amplitude modulation driven by the uplink driver 950 on the same line, according to the uplink data. The low modulation index requirement discussed previously with respect to FIG. 4 is satisfied by controlling the values of RM1 and the output resistor of the uplink driver, RR1. The modulation index is given as RM1/(RM1+RR1).

Figure 10:
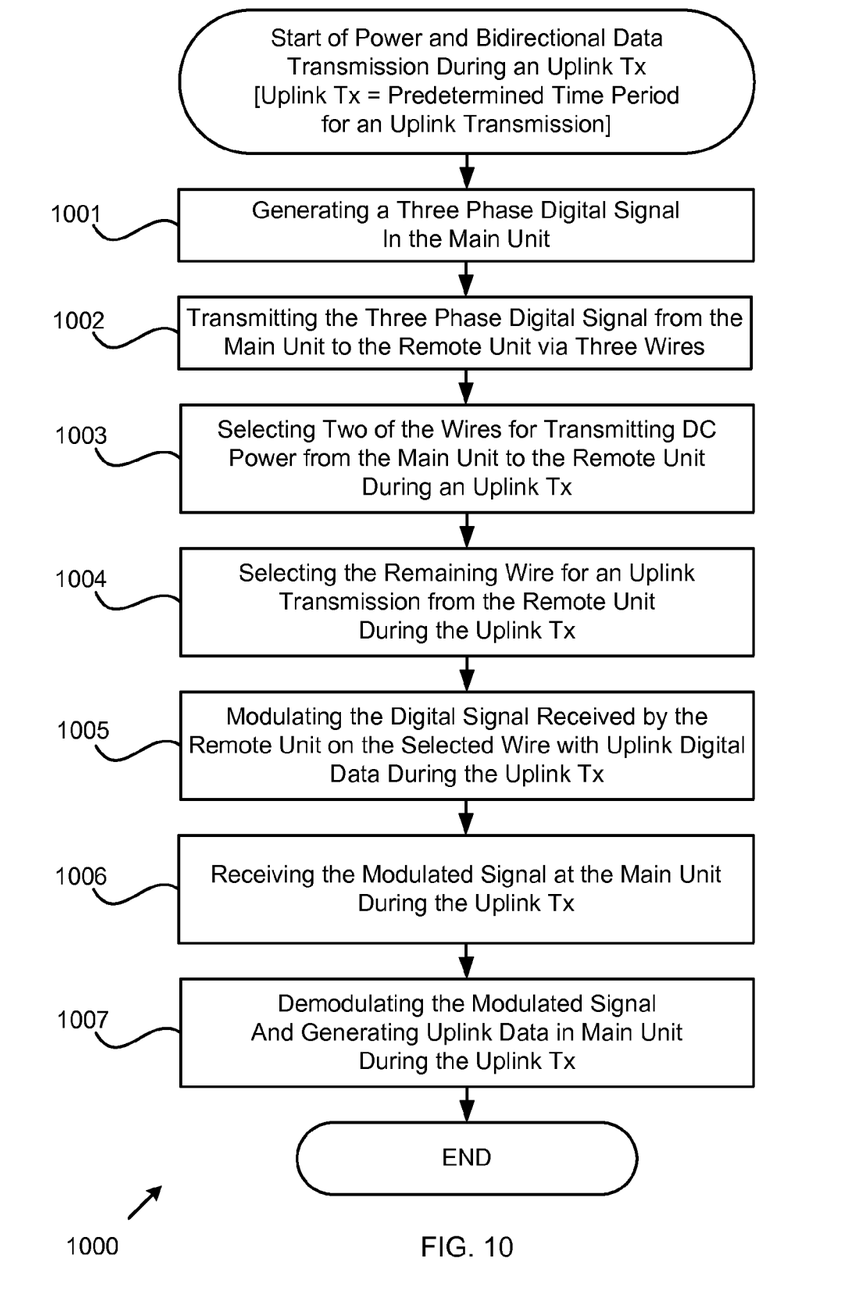
FIG. 10 is a flow diagram for an exemplary method for power and bidirectional data transmission according to one embodiment of the present invention.

FIG. 10 is a flow diagram for an exemplary method 1000 for power and bidirectional data transmission during a predetermined time period for an uplink transmission (herein: Uplink Tx), according to one embodiment of the present invention. Method 1000 starts in block 1001 with the generating of a three phase digital signal, such as Q1-Q3 by generator 710. Flow proceeds to block 1002 and the three phase digital signal Q1-Q3 is transmitted from the main unit 110 to the remote 150 via three wire bundle 130. Flow proceeds to block 1003 and two of the three wires are selected for DC power transmission from the main unit 110 to the remote unit 150 during an Uplink Tx. Flow proceeds to block 1004 and the remaining wire is selected for an uplink transmission from the remote 150 to the main unit 110 during an Uplink Tx.

Flow proceeds to block 1005 and the digital signal received by the remote 150 on the selected wire is modulated with uplink digital data during the Uplink Tx. Flow proceeds to block 1006 and the signal modulated with uplink data is received by the main unit 110 during the Uplink Tx. Flow proceeds to block 1007 and the modulated signal received from the remote 150 is demodulated and uplink data is generated at the main unit 110 during the Uplink Tx.

Figure 11:
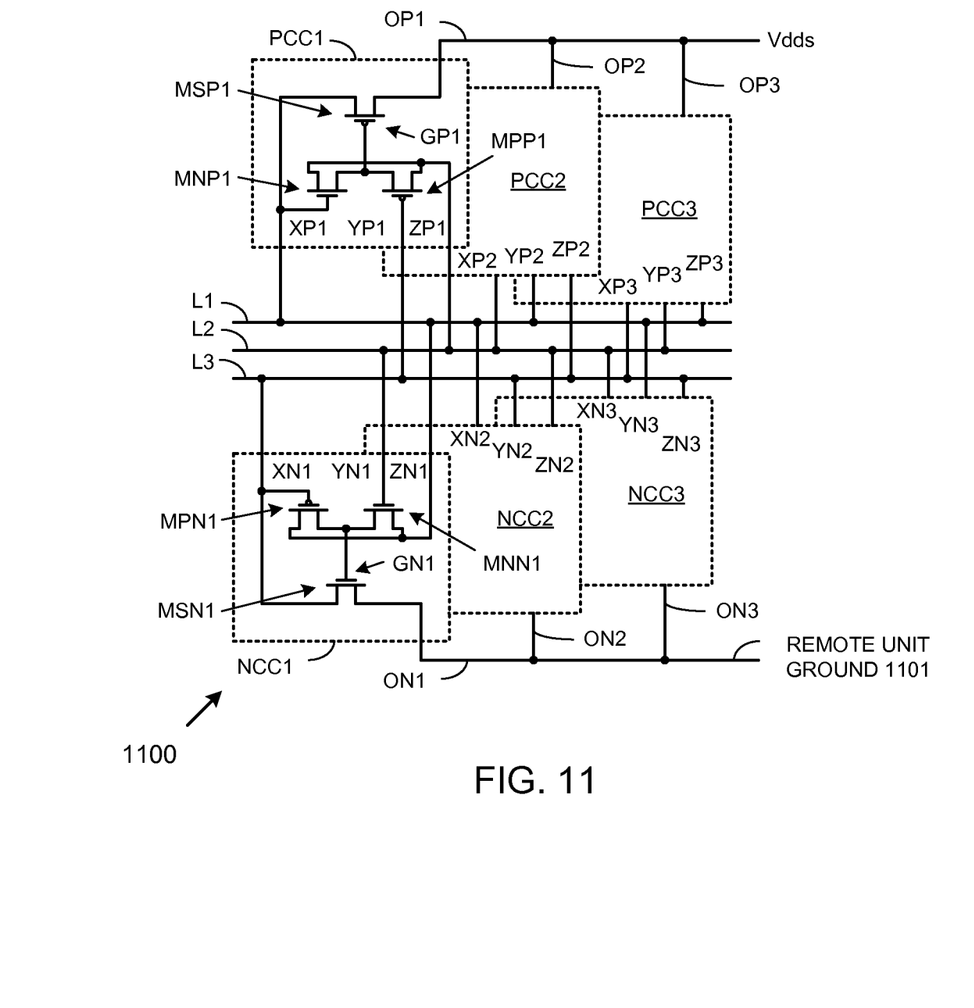
FIG. 11 is a block diagram of a multiphase signal to DC signal converter, according to one embodiment of the present invention.

FIG. 11 is a block diagram of a multiphase signal to DC signal converter 1100 in remote unit 150, according to one embodiment of the present invention. Converter 1100 includes PMOS conversion cells PCC1-3 and NMOS conversion cells NCC1-3 coupled to wires L1-L3. DC supply voltage Vdds for the remote unit 150 is generated from the three phase signal from the main unit 110 using converter 1100. A three phase signal can be rectified using diodes. Converter 1100 uses a passive MOS based design as shown in FIG. 11. Such a design has no diode voltage drops and it provides high efficiency. Converter 1100 includes three PMOS (PCC1-3) and 3 NMOS (NCC1-3) conversion cells.

In PCC1, MNP1 will turn on between edges 511 and 521, shown in FIG. 5, driving node GP1 to a low voltage such that MSP1 turns on, supplying current from L1 to Vdds. When L2 goes high, node GP1 will be pulled to a high voltage through MPP1, turning off MSP1 and allowing no current flow from L1 to Vdds. Node GP1 will remain high when both MNP1 and MPP1 are off between edges 532 and 513 due to dynamic charge storage on node GP1. As a result, PCC1 only conducts current to Vdds between edges 511 and 521. Similarly, PCC2 and PCC3 will conduct current to Vdds between two rising edges of the three phase signal, namely between edges 521 and 532 for PCC2 and between edges 532 and 513 for PCC3. Similarly, conversion cells NCC1-3 pass currents from the ground of the remote 150 to L1-L3. Each NCC1-3 conducts current between two falling edges of the three phase signal. The output voltage of converter 1100 is mainly limited by the current drawn from the load and the switch resistances. Converter 1100 will start operating when the voltage of the three phase signal is higher than the MOSFET threshold voltages.

Although the preceding description describes various embodiments of the system, the invention is not limited to such embodiments, but rather covers all modifications, alternatives, and equivalents that fall within the spirit and scope of the invention. Since many embodiments of the invention can be made without departing from the spirit and scope of the invention, the invention resides in the claims hereinafter appended.

I claim:

1. A system for power and bidirectional data transmission between a main unit and a remote unit via a plurality of wires during a predetermined time period for an uplink transmission, the system comprising:
   a plurality of wires coupled between the main unit and the remote unit;
   the main unit comprising:
      a signal generator coupled to the plurality of wires and providing a three phase digital signal transmitted from the main unit to the remote unit via the plurality of wires, wherein each digital signal of the three phase digital signal is coupled to a respective wire of the plurality of wires; and
   the remote unit comprising:
      a line selector coupled to the plurality of wires:
         for selecting two wires of the plurality of wires for transmitting DC power from the main unit to the remote unit during the predetermined time period for an uplink transmission; and
         for selecting the wire of the plurality of wires not chosen for DC power transmission, for an uplink transmission from the remote to the main unit during the predetermined time period for an uplink transmission, wherein the selected wire transmits one digital signal of the three phase digital signal from the main to the remote unit; and
      an uplink modulator coupled to the wire selected for the uplink transmission for modulating the respective digital signal received from the main unit with digital uplink data during the predetermined time period for an uplink transmission.

2. The system of claim 1, wherein the main unit further comprises:
   a plurality of line drivers coupled between the signal generator and the plurality of wires, each line driver having respective input, output and control terminals;
      wherein each control terminal receives a digital bit input corresponding to either a low or high output impedance for the respective line driver;
      each digital signal of the three phase digital signal generated by the signal generator is coupled to an input terminal of a respective line driver;
      each output terminal of each line driver is coupled to a respective wire of the plurality of wires;
      each line driver output is configured to a low output impedance, by a first state of the digital bit input received on its respective control line, when the line driver is coupled to a wire selected for transmitting power from the main unit to the remote unit; and
      each line driver output is configured to an output impedance higher than the low output impedance, by a second state of the digital bit input received on its respective control line, when the line driver is coupled to a wire selected for the predetermined time period for an uplink transmission.

3. The system of claim 2, wherein the main unit further comprises:
   a line selector coupled to the plurality of wires and coupled to the control terminal of each respective line driver, and
   an uplink demodulator with an input and an output;

wherein the line selector is configured:
- to select one of the plurality of line drivers corresponding to a selected wire for receiving an uplink transmission from the remote unit, and
- for coupling the selected wire to the input of the uplink demodulator, during the predetermined time period for an uplink transmission;

wherein the line selector provides a digital bit input to the control terminal of the selected line driver to set the output impedance of the line driver to a high output impedance during the predetermined time period for an uplink transmission.

4. The system of claim 3, wherein the uplink demodulator coupled to the selected wire for receiving the uplinked modulated signal, generates received uplink digital data during the predetermined time period for an uplink transmission.

5. The system of claim 1, wherein the uplink modulator comprises an amplitude modulator.

6. The system of claim 3, wherein the signal modulated with uplink digital data is within the noise margin of the input of the uplink demodulator in the main unit.

7. The system of claim 1, wherein the predetermined time period for an uplink transmission is coincident in time with the value of each digital signal of the three phase digital signal being in a constant digital state.

8. The system of claim 1, wherein each digital signal of the three phase digital signal has no edge transitions during the predetermined time period for an uplink transmission.

9. The system of claim 1, wherein the signal generator further comprises a pulse edge modulator for modulating the three phase digital signal with digital downlink data to generate a pulse edge modulated signal, and the pulse edge modulated signal is transmitted from the main unit to the remote unit over the plurality of wires.

10. The system of claim 9, wherein the remote unit further comprises a pulse edge demodulator coupled to the plurality of wires for demodulating the pulse edge modulated signal received by the remote unit, and to generate thereby received downlink data.

11. The system of claim 10, wherein the signal modulated with downlink digital data is within the noise margin of the input of the pulse edge demodulator in the remote unit.

12. The system of claim 1, wherein the system comprises an implantable system.

13. The system of claim 1, wherein the remote unit further comprises:
- a converter coupled to the selected two wires of the plurality of wires and generating a DC output voltage from the received digital signals of the three phase digital signal during the predetermined time period for an uplink transmission and the generated DC voltage is used to power the remote system.

14. A method for power and bidirectional data transmission between a main unit and a remote unit via a plurality of wires during a predetermined time period for an uplink transmission, the method comprising:
- generating a three phase digital signal three phase digital signal in the main unit;
- transmitting the three phase digital signal to the remote unit via the plurality of wires; and
- performing the following during the predetermined time period for an uplink transmission:
  - selecting two wires of the plurality of wires for transmitting DC power from the main unit to the remote unit;
  - selecting the wire of the plurality of wires not chosen for DC power transmission for an uplink transmission from the remote to the main unit, wherein the selected wire transmits one digital signal of the three phase digital signal from the main unit to the remote unit,
  - modulating the digital signal received by the remote unit on the selected wire with uplink digital data;
  - receiving the modulated signal at the main unit; and
  - demodulating the received modulated signal and thereby generating uplink digital data at the main unit.

15. The method of claim 14, wherein receiving the modulated signal at the main unit further comprises:
- selecting a line driver in the main unit coupled to the respective wire selected for the uplink transmission from the remote unit to the main unit; and
- setting the output impedance of the line driver coupled to the selected wire to a higher output impedance than the output impedance used for power transmission.

16. The method of claim 14, wherein modulating the signal comprises amplitude modulation.

17. The method of claim 14, wherein demodulating the received modulated signal further comprises:
- coupling the received modulated signal to the input of an uplink demodulator in the main unit, wherein the signal modulated with uplink digital data is within the noise margin of the input of the uplink demodulator.

18. The method of claim 14, wherein generating the three phase digital signal further comprises:
- modulating the three phase digital signal with downlink digital data to generate a pulse edge modulated signal.

19. The method of claim 18 and further comprising:
- demodulating the pulse edge modulated signal in a pulse edge demodulator in the remote unit.

20. The method of claim 19, wherein the pulse edge demodulator in the remote unit receives a modulated three phase digital signal that is within the noise margin of the input of the pulse edge demodulator.

* * * * *